United States Patent
Doi et al.

(10) Patent No.: US 8,657,457 B2
(45) Date of Patent: Feb. 25, 2014

(54) LED SURFACE COVER, AND LED LIGHTING SYSTEM, DISPLAY DEVICE

(75) Inventors: Motohiro Doi, Mie (JP); Tatsuhito Ishii, Mie (JP); Eiji Yuasa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/395,411

(22) PCT Filed: May 27, 2011

(86) PCT No.: PCT/JP2011/062285
§ 371 (c)(1),
(2), (4) Date: Mar. 9, 2012

(87) PCT Pub. No.: WO2011/152326
PCT Pub. Date: Dec. 8, 2011

(65) Prior Publication Data
US 2012/0250318 A1    Oct. 4, 2012

(30) Foreign Application Priority Data

May 31, 2010 (JP) ................................. 2010-125236

(51) Int. Cl.
*G09F 13/04* (2006.01)
(52) U.S. Cl.
USPC ........................................ 362/97.1; 362/235
(58) Field of Classification Search
USPC ......... 362/240, 347, 327, 350, 235, 355, 97.1
See application file for complete search history.

(56) References Cited

U.S. PATENT DOCUMENTS

| | | | | |
|---|---|---|---|---|
| 5,841,596 | A | * | 11/1998 | Perlo et al. ..................... 359/859 |
| 2006/0158899 | A1 | | 7/2006 | Ayabe |
| 2008/0273345 | A1 | | 11/2008 | Yajima |

FOREIGN PATENT DOCUMENTS

| | | | |
|---|---|---|---|
| CN | 2699114 Y | | 5/2005 |
| CN | 1722484 A | | 1/2006 |
| CN | 1819287 A | | 1/2006 |
| EP | 1617132 A2 | | 1/2006 |
| EP | 1681509 A | | 7/2006 |
| JP | 06-163993 A1 | | 6/1994 |
| JP | 10-082916 A | | 3/1998 |
| JP | 2000-270009 A | | 9/2000 |
| JP | 2000-315406 A | | 11/2000 |
| JP | 2004-055168 A | | 2/2004 |
| JP | 2004-311353 A | | 11/2004 |
| JP | 2006-222413 A | | 8/2006 |
| JP | 2008-097848 A | | 4/2008 |
| KR | 10-2006-0083876 A | | 7/2006 |

* cited by examiner

*Primary Examiner* — Anne Hines
(74) *Attorney, Agent, or Firm* — Hedman & Costigan, P.C.; James V. Costigan; Kathleen A. Costigan

(57) ABSTRACT

An LED surface cover (1) consists of a resin molding and has a main reflector (2) which reflects light forward from a surface light source and a subsidiary reflector (3) having a reflection surface which reflects light emitted from an LED light source (4) to the main reflector (2). The main reflector (2) has an aperture portion (2a) were the LED light source can be disposed and has a curved surface for traveling light reflected from the subsidiary reflector (3) to a region forward from the surface light source. The subsidiary reflector (3) is disposed above the aperture portion (2a) formed on the main reflector (2). The reflection surface of the subsidiary reflector (3) has an inclination with respect to a surface of the aperture portion (2a). The present invention provides a lighting system capable of accomplishing surface emission by carrying out a simple method, even though the LED light source (4) having a strong directivity is used.

24 Claims, 17 Drawing Sheets (a)

(b)

LED SURFACE COVER, AND LED LIGHTING SYSTEM, DISPLAY DEVICE

TECHNICAL FIELD

The present invention relates to an LED surface cover and a lighting system, and a display device in which the LED surface cover is used.

BACKGROUND ART

A lighting system using a light source such as a light-emitting diode (hereinafter referred to as LED) having a strong directivity is put into practical use. Because the LED has a strong directivity, it is difficult to obtain a uniform luminance distribution on a surface in a wide range by using one LED light source.

As a surface light source apparatus disposed immediately below the liquid crystal display panel, the surface light source apparatus is known (patent document 1) in which the light source insertion portion is concavely formed on the rear surface of the light guide plate, the light source is accommodated inside the light source insertion portion, the light reflection surface is disposed forward from the light source so that light emitted forward from the light source is reflected on the optical reflection surface to travel the light to the side wall surface of the light source insertion portion.

As a light fitting for a vehicle using the LED as its light source, the light fitting for a vehicle is known. The light fitting has a main reflector for traveling light forward from the light fitting, the light projection means for projecting the light of the LED into the main reflector so disposed as to face the open portion, and the subsidiary reflector so disposed at the space inside the main reflector as to reflect the light projected by the light projection means toward the main reflector is known (patent document 2).

PRIOR ART DOCUMENT

Patent Document

Patent document 1: Japanese Patent Application Laid-Open No. H10-82916
Patent document 2: Japanese Patent Application Laid-Open No. 2000-270009

SUMMARY OF THE INVENTION

Problem to be Solved by the Invention

The LED has a strong directivity. Thus it is necessary to dispose a large number of LEDs for the conventional LED lighting system to use it as a surface emission lighting system having a uniform luminance. In the patent document 1, because the light guide plate is used, there is a fear that the lighting efficiency deteriorates by the amount of light which passes therethrough. In the patent document 2, to emit the LED light forward from the light fitting, it is necessary to dispose the inner lens above the LED and the subsidiary reflector at approximately the focal point of the inner lens. Thus the patent document 2 has a problem that it is impossible to produce the surface emission lighting system having a uniform luminance by using a simple method.

The present invention has been made to cope with the above-described problems and has for its object to provide an LED surface cover which allows a surface emission lighting system to be obtained by using a simple method, even though an LED light source having a high directivity is used and a small number of the LEDs is used and provide a lighting system and a display device.

Means for Solving the Problem

The present invention provides an LED surface cover for converting an LED light source into a surface light source by covering the LED light source therewith.

The LED surface cover is made of a resin molding and has a main reflector which reflects light forward from the surface light source and a subsidiary reflector having a reflection surface which reflects light emitted from the LED light source to the main reflector. The main reflector has an aperture portion where the LED light source can be disposed and has a curved surface for traveling light reflected from the subsidiary reflector to a region forward from the surface light source. The subsidiary reflector is disposed above the aperture portion formed on the main reflector. The reflection surface of the subsidiary reflector has an inclination with respect to a surface of the aperture portion.

The resin molding constructing the LED surface cover of the present invention is an integrally molded article formed by using a die.

A projected area of the subsidiary reflector on a surface of the surface light source is set to not more than an area of the aperture portion.

The subsidiary reflector has a supporting pillar for coupling the subsidiary reflector and the main reflector to each other. The supporting pillar is a polygon whose cross-section has at least one pair of parallel lines. A median line of the parallel lines is disposed along an optical axis of the light emitted from the LED light source. A cross-section of a base portion of the supporting pillar coupling the subsidiary reflector and the main reflector to each other at a main reflector-side is set larger than a cross-section of a portion of the supporting pillar at a subsidiary reflector-side. The cross-section of the base portion of said supporting pillar at the main reflector-side is a quadrangle. A length of any of sides of the quadrangle other than a pair of parallel lines constructing the quadrangle is less than ⅔ of a maximum length of the parallel lines.

The subsidiary reflector constructing the LED surface cover of the present invention has a reflection surface consisting of a polyhedron or an inverted conic surface having an apex at a light-source side of an optical axis of light emitted upward from the LED light source. The polyhedron is favorable. The polyhedron has configurations described in the following (1), (2) or (3) or configurations in combination of (1), (2) or (3) and (4).

(1) The subsidiary reflector has a reflection surface consisting of a tetrahedron having an apex disposed at the light-source side of the optical axis of the light emitted upward from the LED light source and has a reflection surface whose sectional surface in the optical axis direction is V-shaped at the apex disposed at the light-source side.

(2) The subsidiary reflector has a reflection surface which consists of a tetrahedron having an apex on the optical axis of the light emitted upward from the LED light source. One sectional surface of the reflection surface in the optical axis direction is V-shaped at the apex. A sectional surface of the reflection surface in a direction intersecting with the V-shaped sectional surface is inverted. V-shaped.

(3) in the subsidiary reflector, at least one of a side surface of the reflection surface and a rear surface thereof has a predetermined curvature.

(4) The reflection surface of the subsidiary reflector is subjected to treatment for improving the optical reflectivity of the reflection surface. As the treatment for improving the optical reflectivity thereof, coating consisting of a metal film, plating, painting, and the like are listed.

An LED lighting system of the present invention has an LED light source and as LED surface cover so disposed that the LED light source is positioned at an aperture portion of the LED surface cover.

The LED light source and the LED surface cover are disposed inside a housing. A functional film is mounted on a front surface of the LED surface cover.

The functional film is a light diffusion film or a laminate film composed of the light diffusion film and a brightness enhancement film and/or a light reflection decrease film.

A display device of the present invention has the LED lighting system as one display segment thereof.

Effect of the Invention

The LED surface cover of the present invention made of the resin molding has the main reflector which reflects light forward from the surface light source and the subsidiary reflector having the reflection surface which reflects light emitted from the LED light source to the main reflector. The subsidiary reflector is disposed above the aperture portion formed on the main reflector. The reflection surface of the subsidiary reflector has the inclination with respect to the surface of the aperture portion. Therefore the light emitted from the LED light source can be effectively reflected toward the main reflector via the subsidiary reflector. As a result, the light reflected from the main reflector is not a point light source, but a surface light source. That is, by covering the LED light source having a strong directivity with the LED surface cover of the present invention, the LED light source which is the point light source is converted into the surface light source.

The LED surface cover is the integrally molded article formed by using a molding die. The projected area of the subsidiary reflector on the surface of the surface light source is set to not more than the area of the aperture portion. Therefore the LED surface cover is easily releasable from the molding die, and the moldability of the LED surface cover which is a resin molding is improved.

The cross-section of the supporting pillar for coupling the subsidiary reflector and the main reflector to each other is a polygon having at least one pair of parallel lines. The median line of the parallel lines is disposed along the optical axis of the light radially emitted from the LED light source. This construction hardly gives influence on light beams. Therefore the light emitted from the LED light source can be efficiently utilized for illumination.

The cross-section of the base portion of the supporting pillar at the main reflector-side is a quadrangle. The length of any of the sides of the quadrangle other than a pair of the parallel lines constructing the quadrangle is less than ⅔ of the maximum length of the parallel lines. Further the cross-section of the base portion of the supporting pillar at the main reflector-side is set larger than the cross-section of the portion of the supporting pillar at the subsidiary reflector-side. Therefore resin can be easily injected into a molding die and thus the strength of the molded article can be ensured. Thus it is possible to obtain the LED surface cover which satisfies the optical properties, has little molding strain, and is stable in its quality.

The subsidiary reflector constructing the LED surface cover of the present invention has the configuration of (1) The subsidiary reflector has the reflection surface consisting of the tetrahedron having the apex disposed at the light-source side of the optical axis of the light emitted upward from the LED light source and has the reflection surface whose sectional surface in the optical axis direction is V-shaped at the apex disposed at the light-source side or (2) The subsidiary reflector has the reflection surface which consists of the tetrahedron having the apex on the optical axis of the light emitted upward from the LED light source. One sectional surface of the reflection surface in the optical axis direction is V-shaped at the apex. The sectional surface of the reflection surface in the direction intersecting with the V-shaped sectional surface is inverted V-shaped or (3) in the subsidiary reflector, the side surface of the reflection surface and/or a rear surface thereof have the predetermined curvature. Therefore the light emitted from the LED light source which is the point light source can be efficiently reflected on the reflection surface of the main reflector.

Treatment such as reflection coating consisting of a metal film, plating, painting is performed on the reflection surface of the subsidiary reflector to improve the optical reflectivity thereof. Therefore the light can be efficiently reflected on the reflection surface of the main reflector.

The LED lighting system of the present invention has the LED light source and the LED surface cover so disposed that the LED light source is positioned at the aperture portion of the LED surface cover. Therefore it is possible to convert the LED light source which is the point, light source into the surface light source by a simple method. Thereby the LED lighting system of the present invention provides surface light source illumination having uniform luminance by using a small number of the LED light sources.

By using LED lighting system in combination with the functional film, surface light source illumination having a uniform luminance is obtained.

In the LED lighting system of the present invention, one LED light source is converted into the surface light source. Therefore the display device having a small number of the LED light sources can be produced.

BEST MODE FOR CARRYING OUT THE INVENTION

Figure 1:
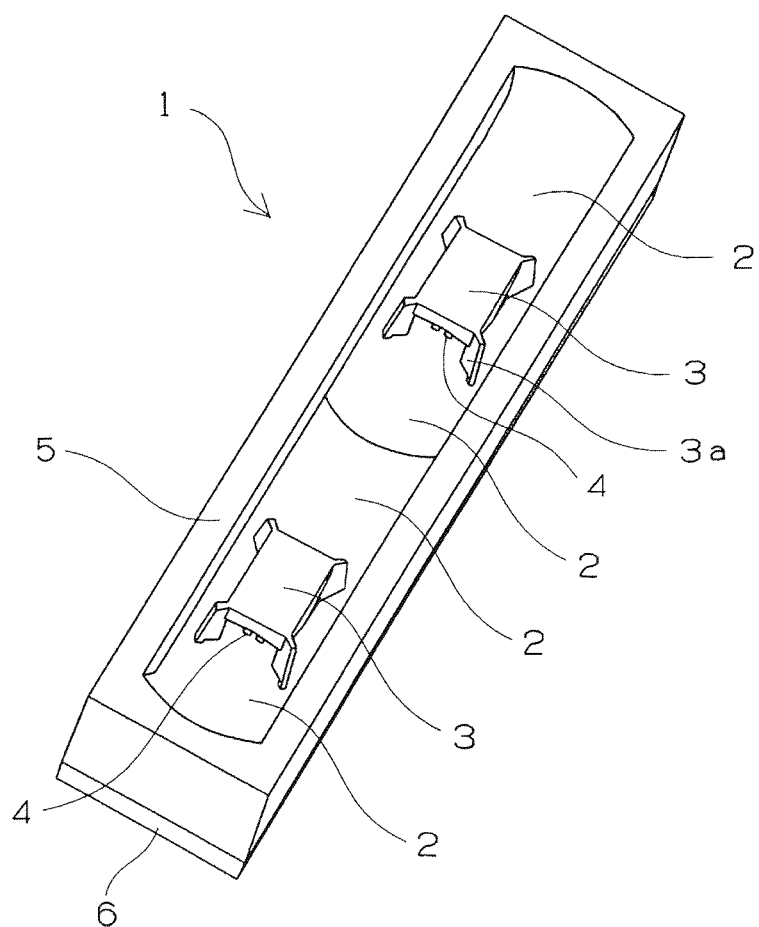
FIG. 1 is a perspective view showing an entire LED surface cover.

FIG. 1 is a perspective view showing an entire LED surface cover according to one embodiment of the present invention. An LED surface cover 1 is a surface light emission cover for obtaining an LED lighting system having a rectangular light emission surface.

The surface light emission cover 1 is an example of the LED surface cover in which two subsidiary reflectors are disposed in a row in the longitudinal direction thereof with respect to the rectangular light emission surface. The surface light emission cover 1 is constructed of a main reflector 2 which reflects light forward from a surface light source and a subsidiary reflector 3 having a reflection surface which reflects light emitted from an LED light source 4 to the main reflector 2. It is possible to provide a housing 5 for forming the rectangular light emission surface on the periphery of the surface emission cover. According to the configuration of the light emission surface, various configurations such as a circular configuration, a rectangular configuration, and desired configurations can be adopted as the configuration of the housing 5. The LED light source 4 is mounted on a substrate 6. As the configuration of the substrate 6, desired configurations can be adopted according to the number of LEDs and the position thereof.

To protect the main reflector 2 and the subsidiary reflector 3 and obtain a uniform surface luminance, a functional film 8 light-transmissive or light-semi-transmissive can be disposed on a front surface of the housing 5.

Figure 2:
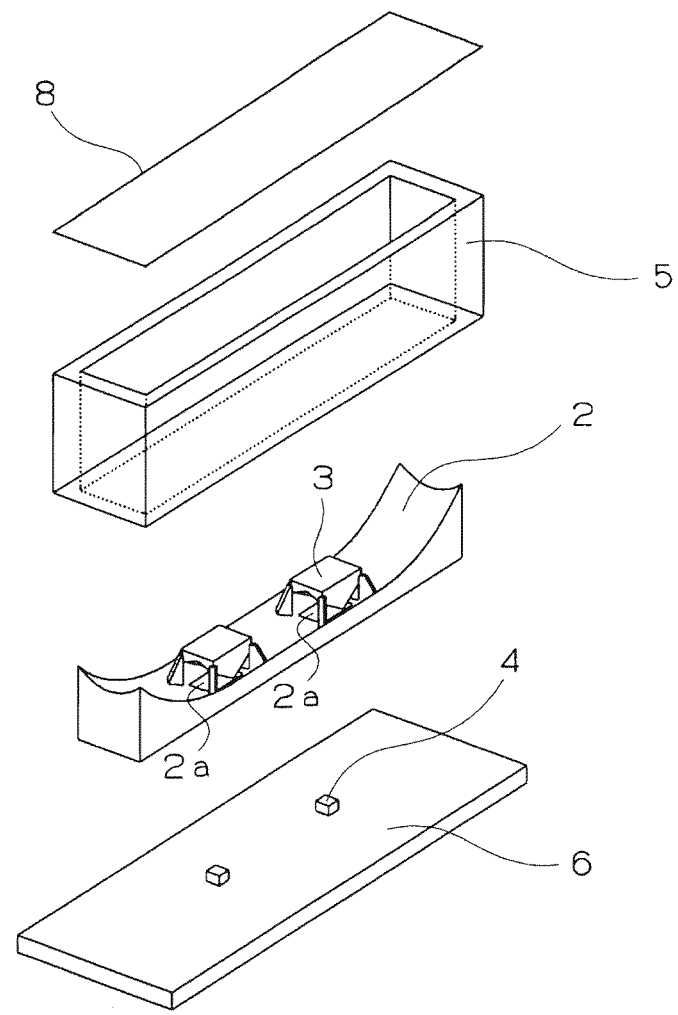
FIG. 2 is an exploded perspective view showing a lighting system.

FIG. 2 is an exploded perspective view showing a state in which the LED surface cover 1 covers the LED light source 4.

In FIG. 2, the LED light source 4 is mounted on the substrate 6. As the LED light source 4, it is possible to use a bombshell type LED light source in addition to a surface-mount type LED. Because the LED surface cover of the present invention has a construction of diffusing light in a wide range, the surface-mount type LED can be preferably used.

As the LED light source 4, it is possible to use a monochromatic LED such as a red LED, a green LED, and a blue LED; white LED; or an LED of RGB type having the red LED, the green LED, and the blue LED.

As shown in FIG. 2, it is possible to convert the LED light source 4 into the surface light source by merely placing the LED surface cover 1 on the LED light source 4 mounted on the substrate 6.

The LED surface cover 1 can be used by providing it with only the main reflector 2 and the subsidiary reflector 3 formed by integral molding.

It is possible to compose the LED surface cover 1 of the main reflector 2, the subsidiary reflector 3, and the housing 5 formed by integral molding. In the LED surface cover 1, the functional film 8 light-transmissive or light-semi-transmissive may be mounted on an upper surface of the housing 5.

Figure 3:
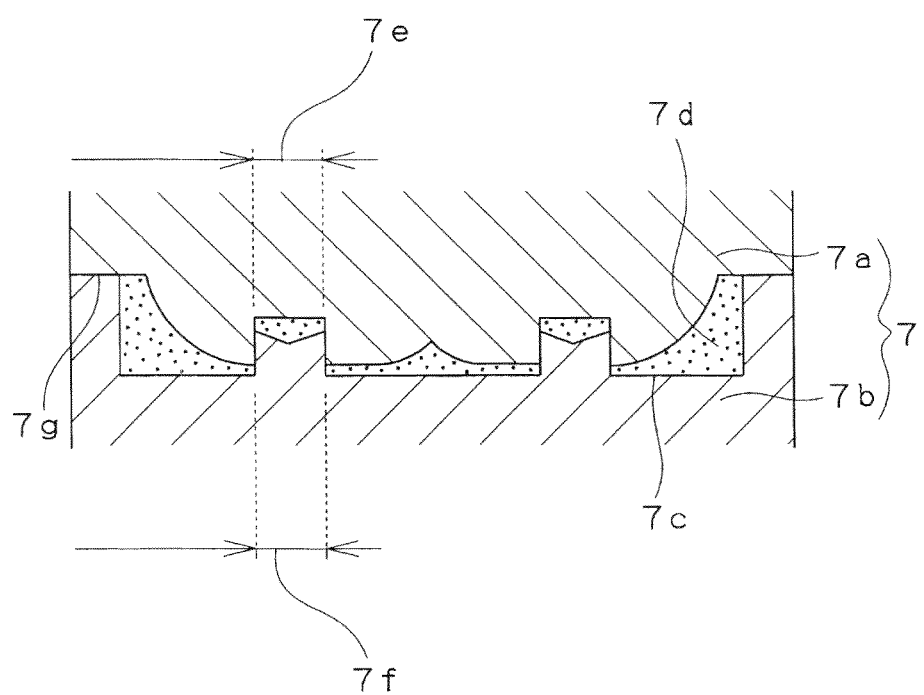
FIG. 3 shows a die block construction.

The main reflector 2 and the subsidiary reflector 3 can be produced as an integrally molded article by molding a resin with a die. FIG. 3 shows a die block construction for forming the main reflector 2 and the subsidiary reflector 3 by integrally molding the resin.

By butting a stationary-side template 7a and a movable-side template 7b against each other, a cavity 7c is formed in a die 7. A resin 7d is injected from an unshown gate into the cavity 7c.

In the present invention, a projected area of the subsidiary reflector 3 with respect to the surface of the surface light source is set to not more than the area of an aperture portion 2a of the main reflector 2. For example, in the die block construction shown in FIG. 3, a distanced 7e reflecting the projected area of the subsidiary reflector 3 is set to not more than a distance 7f reflecting the area of the aperture portion 2a of the main reflector.

By adopting the die block construction, when the stationary-side template 7a and the movable-side template 7b are butted against each other, a construction in which the templates 7a and 7b slide on each other is not formed along a butting surface (PL) 7g. Thus the die can be easily produced. Thereby the die can be produced at a low cost, and the production stability at resin molding time can be improved.

The subsidiary reflector 3 has supporting pillars 3a for coupling the main reflector 2 and the subsidiary reflector 3 to each other. In FIG. 1, one subsidiary reflector 3 is supported by four supporting pillars 3a. Although the number of the supporting pillars 3a is not limited to a specific number, the number thereof is set to preferably two or four to sufficiently obtain optical properties and the strength of a molded article.

Figure 4:
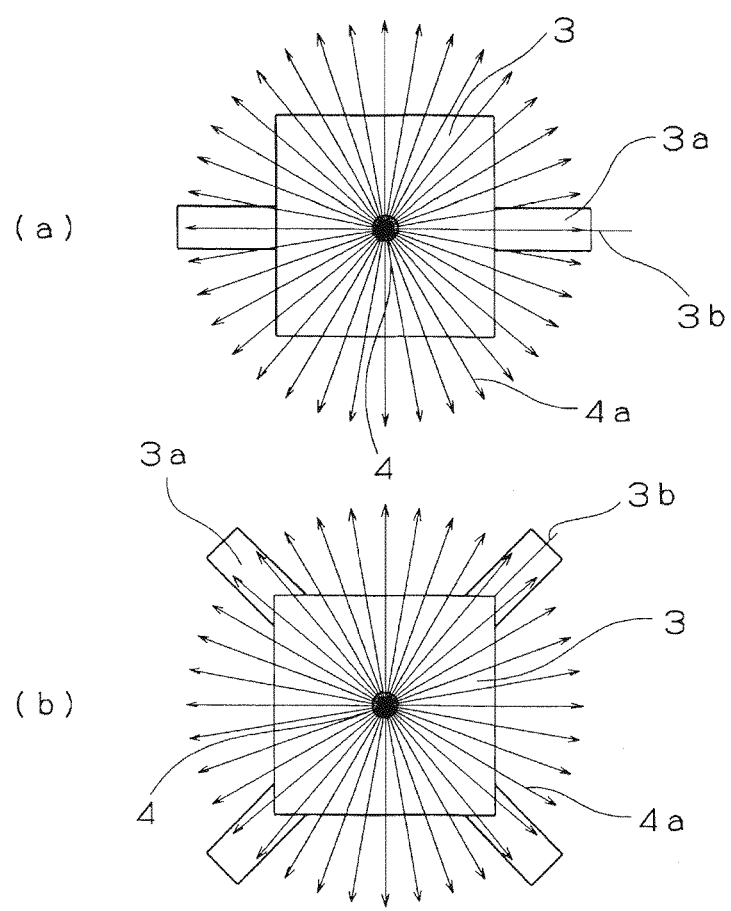
FIG. 4 is a plan view obtained when a subsidiary reflector is seen in the direction of a surface of a surface light source.

FIG. 4 is a plan view obtained when the subsidiary reflector 3 is seen in the direction of the surface of the surface light source, namely, a plan view in which the LED surface cover 1 is seen from above. For explanation, the LED light source 4 is shown with a solid line. In FIG. 4(a), the supporting pillar 3a is disposed in the direction of the sides of the subsidiary reflector 3. In FIG. 4(b), the supporting pillar 3a is disposed in the direction of the apexes of the subsidiary reflector 3. FIG. 4 (a) and FIG. 4(b) illustrate the state where the supporting pillar 3a is disposed and the direction of an optical axis of light emitted radially from the LED light source 4.

The supporting pillar 3a is rectangular in its cross-section. A line 3b connecting the middle points of both short sides of the rectangle is disposed along the direction of the optical axis 4a of the light, emitted radially from the LED light source 4.

The rectangular cross-section of the pillar 3a includes the configuration shown in FIG. 4(b). When the supporting pillar 3a is disposed in the direction of the apexes of the subsidiary reflector 3, it is possible to simplify the configuration of the die and decrease the cost for molding and processing resin.

In FIG. 4, the supporting pillar 3a is rectangular in its cross section. But the supporting pillar 3a may be a polygon, provided that it has at least one pair of parallel lines and that the median line of the parallel lines extends along the optical axis. It is possible to exemplify polygons whose sectional configurations are pentagonal, trapezoidal, and parallelogrammatic.

Because there is a possibility that the supporting pillar 3a obstructs light emitted radially from the LED light source 4, it is preferable to form the configuration of the cross-section of the supporting pillar 3a as small as possible. But in consideration of the moldability of the resin and the mechanical strength of an obtained resin-molded article, it is preferable to make the thickness of the supporting pillar 3a equal to that of the main reflector 2.

To satisfy the optical property and the moldability, the supporting pillar 3a is set to the rectangular configuration in its cross-section, and the line 3b connecting the middle points of both short sides of the rectangle is disposed in the direction along the optical axis 4a of the light.

By disposing the line 3b in the direction along the optical axis 4a and setting the cross-section of the supporting pillar 3a to the rectangular configuration, it is possible to obtain the effect of improving the moldability owing to an increase in the thickness of the support pillar 3a and the effect of minimizing the loss of light. By setting the cross-section of the supporting pillar 3a to the rectangular configuration and increasing the thickness thereof, the sub diary reflector 3 is supported to a higher extent.

Figure 5:
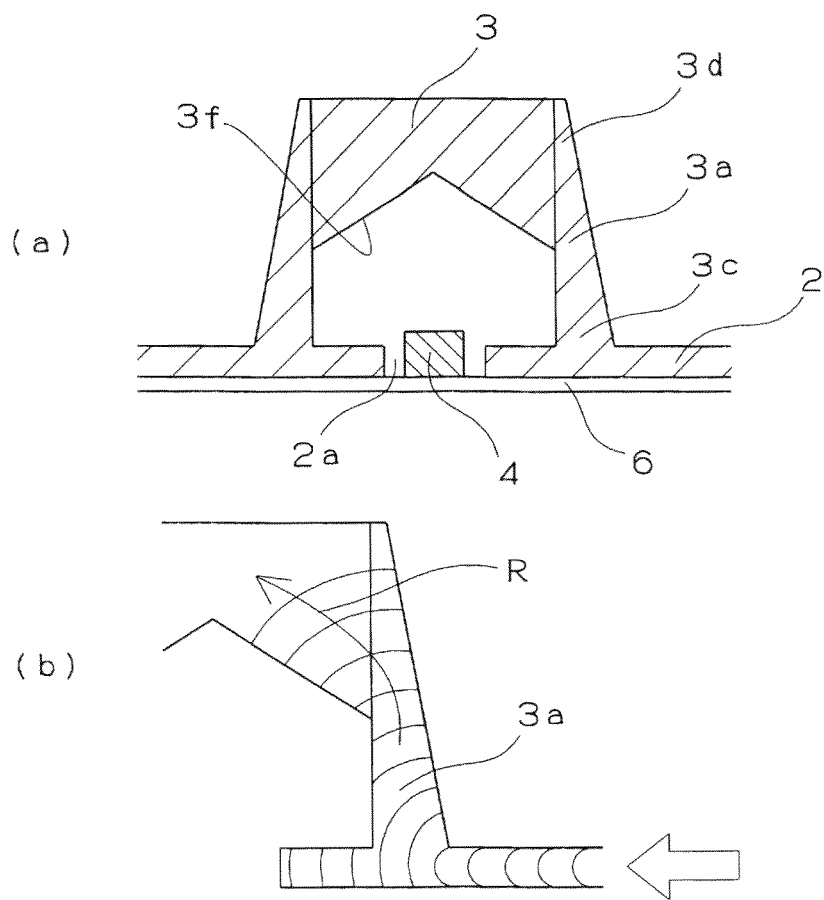
FIG. 5 is a sectional view seen in an erect direction of a supporting pillar.

FIG. 5 is a sectional view of the supporting pillar 3a seen in a direction in which the supporting pillar 3a is erect. FIG. 5(a) shows a state in which the LED surface cover 1 is placed on the LED light source 4. FIG. 5(b) shows a step of injecting a resin into a cavity of a die in which the supporting pillar 3a is formed.

The subsidiary reflector 3 is formed integrally with the main reflector 2 by molding the resin. To allow the subsidiary reflector 3 to be disposed above the LED light source 4 mounted on the substrate 6, the aperture portion 2a is disposed at the side of the main reflector 2. The LED surface cover 1 is placed on only the substrate 6 such that the LED light source 4 is positioned inside the aperture portion 2a. The LED light source 4 is converted into the surface light source with the main reflector 2 serving as an optical radiation surface.

A cross-section of a base portion 3c of the supporting pillar 3a at the side of a main reflector 3 is set larger than a cross-section of a portion 3d thereof at the side of a subsidiary reflector 3. This can be achieved by inclining a surface of the supporting pillar 3a opposed to the LED light source 4.

By forming the sectional construction shown in FIG. 5(a), it is possible to obtain the effect of improving die releasability in a molding operation and the effect of improving the optical performance by decreasing an element which obstructs light owing to a decrease in the volume of the supporting pillar.

As shown in FIG. 5(b), because the main reflector-side base portion of the supporting pillar is the side at which the thick portion of the supporting pillar is disposed, in a resin-filling step at the molding time, the resin easily flows from the main reflector 2 to the supporting pillar 3a and from the supporting pillar 3a to the subsidiary reflector 3, as shown with an arrow R. Therefore it is possible to avoid a trouble such as shortage of filling of resin at an integral molding time.

Figure 6:
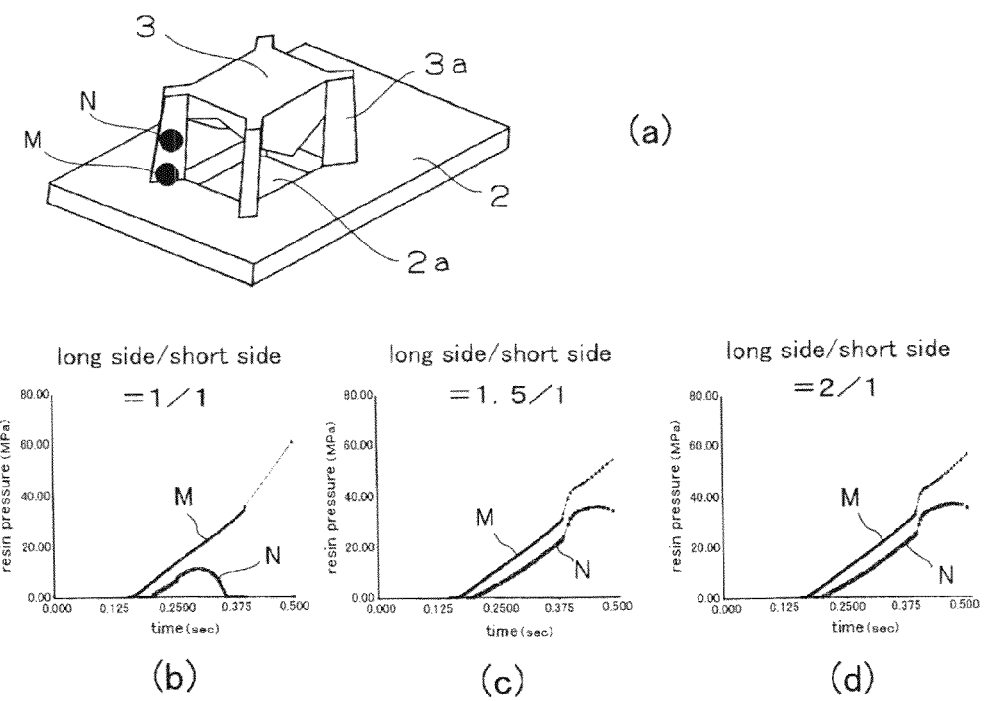
FIG. 6 shows a change in the time history of a resin pressure inside a die when resin is filled in the die.

FIG. 6 shows a change in the time history of a resin pressure inside a die when a resin is filled in the die at the molding time. FIG. 6(a) is a partly enlarged perspective view of the main reflector 2 and the subsidiary reflector 3. FIGS. 6(b) through 6(d) show the change in the resin pressure inside the die with the elapse of time at points M and N in FIG. 6(a). FIG. 6(b) shows a case of [long side/short side]=[1/1] as an example in which the cross-section of the supporting pillar 3a is rectangular. FIG. 6(c) shows a case of [long side/short side]=[1.5/1] FIG. 6(d) shows a case of [long side/short side]=[2/1].

The length of the short side of the cross-section of the supporting pillar 3a is set to a thickness (0.4 mm) so that the loss of light is minimum and molding can be accomplished. The resin pressure applied to two points (M and N) of the supporting pillar were compared with each other when the length of the long side of the cross-section of the base portion at the side of the main reflector 2 was set to 1 time larger, 1.5 times larger, and two times larger than the length of the short side of the cross-section of the base portion.

As shown in FIG. 6(b), when the cross-section of the supporting pillar 3a is rectangular, and the long side of the rectangle and the short side thereof are equal to each other in the lengths thereof, a pressure applied to a central portion (N) of the supporting pillar is approximately 10 MPa. As shown in FIG. 6(c), when the length of the to side of the rectangle is 1.5 times larger than that of the short side thereof, the pressure applied to the central portion (N) of the supporting pillar is 35 MPa. As shown in FIG. 6(d), when the length of the long side of the rectangle is two times larger than that of the short side thereof, the pressure applied to the central portion (N) of the supporting pillar is 35 MPa. Thus the pressure applied to the central portion (N) of the supporting pillar in this case is equal to the pressure applied thereto in the case where the length of the long side of the rectangle is 1.5 times larger than that of the short side thereof. The pressure applied to the central portion (N) of the supporting pillar in these cases is 3.5 times larger than the pressure applied thereto in the case where the length of the long side of the rectangle and that of the short side thereof are equal to each other. Because a high resin pressure is applied to the central portion (N) of the supporting pillar, the resin reaches as far as the subsidiary reflector 3. Thereby occurrence of defective molding such as a shrink mark, short shot, and the like can be prevented. As shown in FIGS. 6(c) and 6(d), there is little difference in the pressure applied to the central portion (N) of the supporting pillar between the case where the length of the long side of the rectangle is 1.5 times larger than that of the short side thereof and the case where the length of the long side of the rectangle is two times larger than that of the short side thereof. When the strength of supporting the subsidiary reflector is considered, it is preferable that [long side/short side]=not less than [1.5/1]. That is, it is preferable that the length of any of sides other than parallel lines is less than ⅔ of a maximum length of a pair of the parallel lines. In consideration of the strength of supporting the subsidiary reflector, it is preferable that [long side/short side]= [1.5/1] to [2/1].

The size of the aperture portion 2a is determined in consideration of the external dimension of the LED light source 4 and soldering dimension thereof. In the case where the LED surface cover is provided with the housing 5, it is preferable that the dimension of the aperture portion 2a is not more than the dimension between wall surfaces of the housing 5.

It is preferable that a reflection surface 3f of the subsidiary reflector 3 is set to not less than 0.1 mm so that the reflection surface 3f does not contact the surface of the LED light source 4 nor more than the height of the aperture portion of the housing.

As the resin which can be used in the present invention, it is possible to use resin which can be formed by an integral mold method such as injection molding. For example, is possible to use a synthetic resin material such as acrylic, polycarbonate, cycloolefin, polyarylate, polystyrene and add a filler to the molded synthetic resin material so that the filler imparts a high reflectivity to a plate consisting of the molded synthetic resin material.

As preferable resin materials, a white filler such as titanium oxide powder is added to polycarbonate resin, and a fire-retardant agent, organopolvsiloxanes, and fluororesins are added thereto. Thereby a resin material having decreased light transmission and improved light reflectivity is obtained.

The light emitted from the LED light source 4 is reflected on the reflection surface of the subsidiary reflector 3. The reflection surface is disposed above the aperture portion 2a with the reflection surface inclining with respect to the surface of the aperture portion 2a formed on the main reflector 2. By inclining the reflection surface, the light emitted from the LED source 4 can be reflected toward the main reflector 2.

It is possible to compose the reflection surface of a polyhedron or an inverted conic surface having an apex at the light source side of the optical axis of the light emitted upward from the LED light source. Of the polyhedron or the inverted conic surface, the polyhedron is favorable as the reflection surface because it is capable of easily control reflected light. A tetrahedron is especially favorable.

The construction of the reflection surface of the subsidiary reflector 3 is described below with reference to FIGS. 7 through 11.

Figure 7:
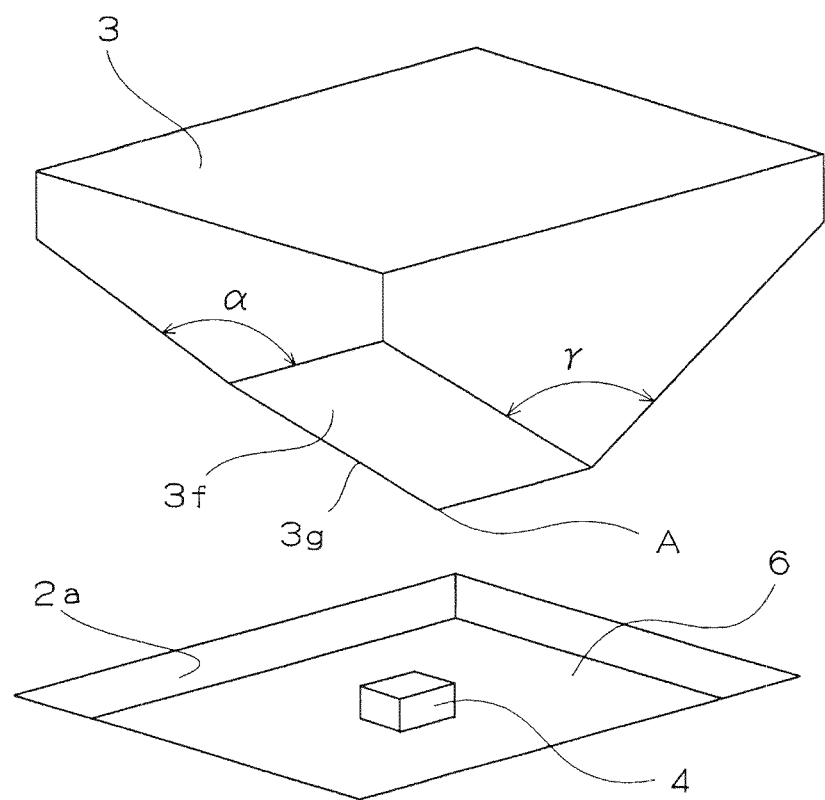
FIG. 7 is a construction diagram of a subsidiary reflector having a quadrangular pyramidal reflection surface.
Figure 8:
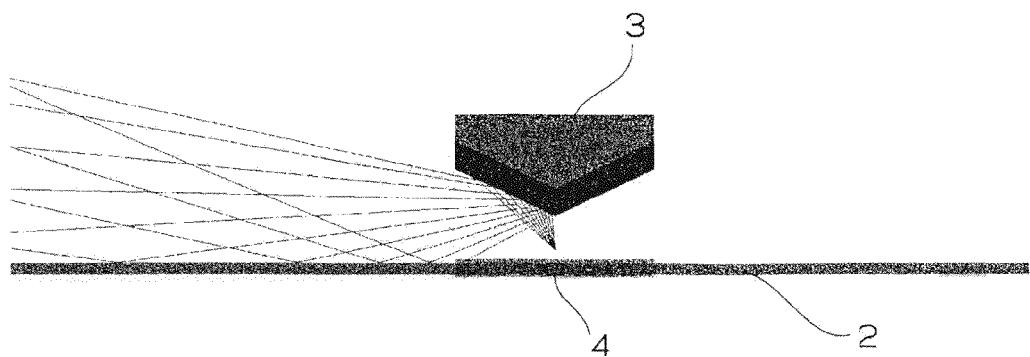
FIG. 8 show beams of light when the subsidiary reflector is used.
Figure 8:
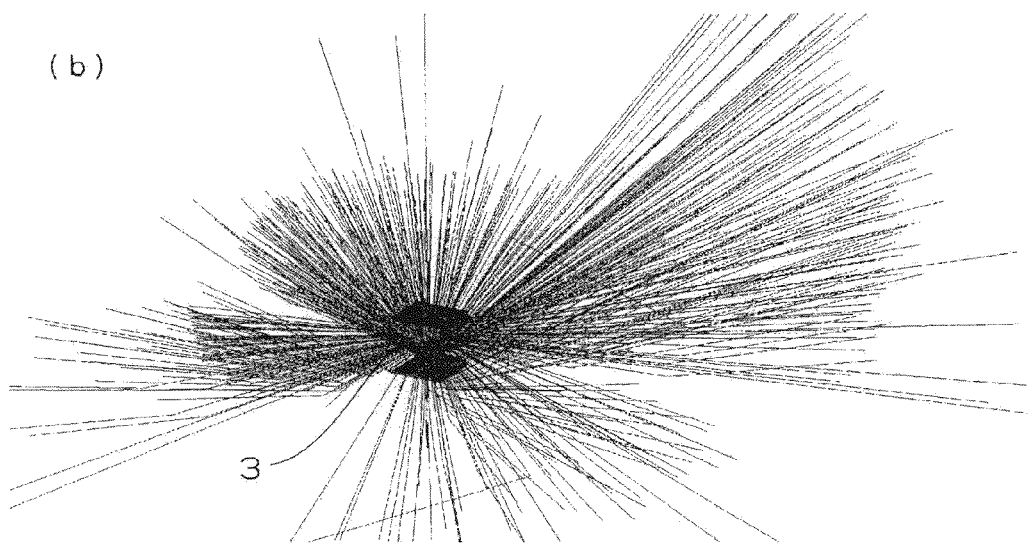

FIG. 7 shows the construction of the subsidiary reflector 3 has the reflection surface 3f which consists of a tetrahedron having an apex A at a light-source side of the optical axis of the light emitted upward from the LED light source 4 and has a reflection surface 3f whose sectional surface in the optical axis direction is V-shaped at the apex A disposed at the light-source side. That is, FIG. 7 shows the construction of the subsidiary reflector 3 having the quadrangular pyramidal reflection surface 3f having the apex A on the optical axis of the LED light source 4. In FIG. 7, the supporting pillar 3a formed integrally with the subsidiary reflector 3 is not shown. FIGS. 8(*a*) and 8(*b*) show beams of light emitted from the LED light source 4.

In FIG. 7, the LED light source 4 is disposed at the center of the aperture portion 2a. The substrate 6 to which the LED light source 4 is fixed is seen in FIG. 7. Because the substrate 6 has a low optical reflectivity, it absorbs light. Therefore light which has entered the aperture portion 2a becomes a loss.

The subsidiary reflector 3 having the quadrangular pyramidal reflection surface 3f having the apex A on the optical axis of the LED light source 4 disposed at the center of the aperture portion 2a is formed, and an optimum angle α according to the directivity of the LED light source 4 is set. By adjusting the angle α, as shown in FIG. 8(*a*), the light reflected from the reflection surface of the subsidiary reflector 3 can be reflected not on the aperture portion 2a but on the main reflector 2 having a high reflectivity.

The angle α is favorably not less than one degree and less than 180 degrees and more favorably 120 to 140 degrees. The angle γ is favorably not less than one degree and less than 180 degrees and more favorably 120 to 140 degrees.

Thereby as shown in FIG. 8(*b*) the light emitted from the LED light source 4 having a high directivity is diffused in four directions. As the configuration of the main reflector 2, the main reflector 2 is so shaped that the light diffused in four directions travels to the light, emission surface. Thereby it is possible to increase the utilization efficiency of the light and obtain surface emission for which a decreased number of the LEDs is used.

Figure 9:
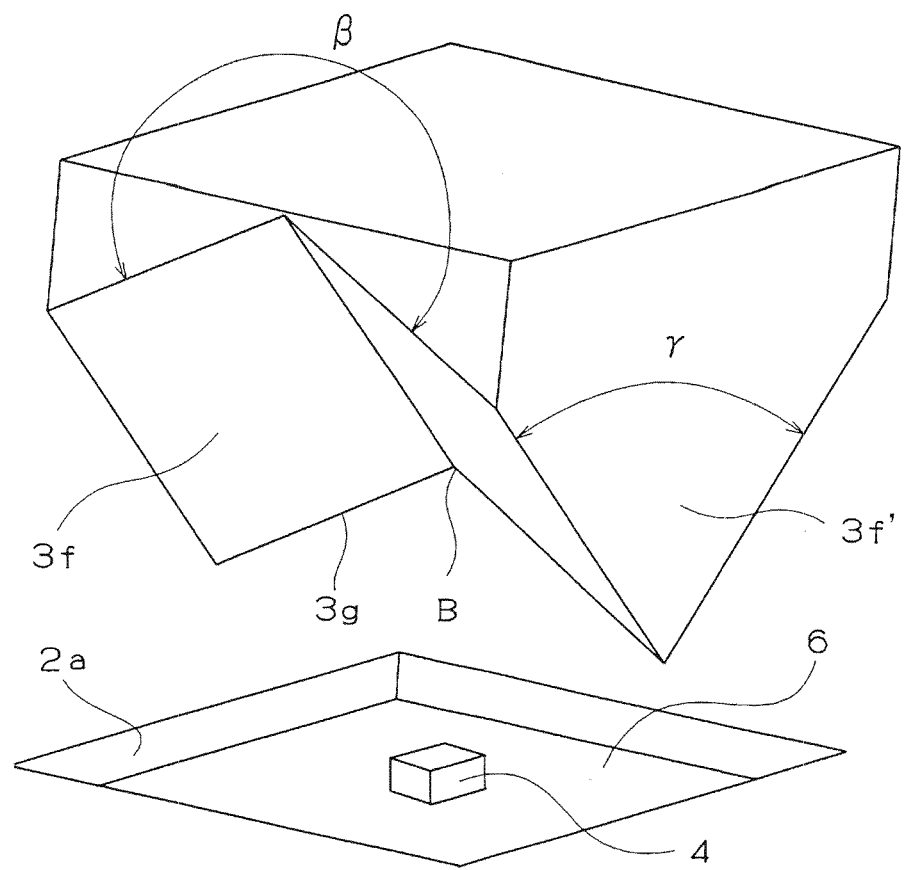
FIG. 9 is a construction diagram of the subsidiary reflector having a reflection surface having a different configuration.
Figure 10:
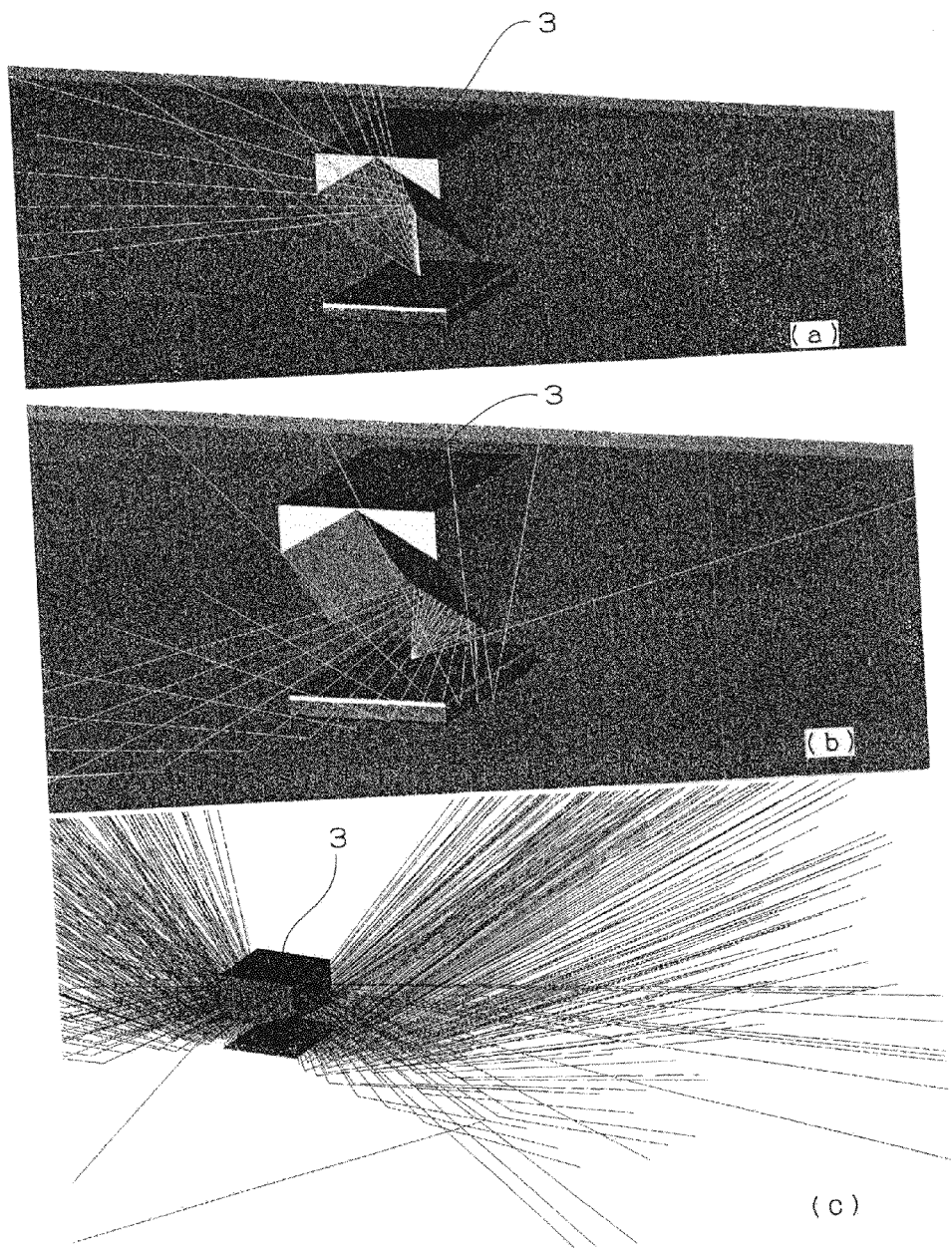
FIG. 10 is a light beam view when the subsidiary reflector shown in FIG. 9 is used.

A subsidiary reflector shown in FIG. 9 has the reflection surface 3f which consists of a tetrahedron having an apex B on the optical axis of the light emitted upward from the LED light source 4. One sectional surface of the reflection surface 3f in the optical axis direction is V-shaped at the apex B. A sectional surface of the reflection surface 3f in a direction intersecting with the above-described sectional surface is inverted V-shaped, in the case of the rectangular surface light source, it is preferable that as the intersecting direction, the surface forming the inverted V shape is orthogonal to the sectional surface such that the surface forming the inverted V shape faces a longitudinal direction. In FIG. 9, the supporting pillar 3a formed integrally with the subsidiary reflector 3 is not shown. FIGS. 10(*a*), (*b*), and (*c*) show beams of light emitted from the LED light source 4.

In FIG. 9, the LED light source 4 is disposed at the center of the aperture portion 2a. The substrate 6 to which the LED light source 4 is fixed is seen in FIG. 9. Because the substrate 6 has a low optical reflectivity, it absorbs light. Therefore light which has entered the aperture portion 2a becomes a loss.

The subsidiary reflector 3 having the apex B on the optical axis of the LED light source 4 disposed at the center of the aperture portion 2a is formed, and optimum angles β and γ according to the directivity of the LED light source 4 are set. By adjusting the angles β and γ, as shown in FIGS. 10(*a*) and 10(*b*), the light reflected from the subsidiary reflector 3 can be reflected not on the aperture portion but on the main reflector 2 having a high reflectivity.

The angle β is favorably more than 180 degrees and less than 340 degrees and more favorably 200 to 240 degrees. The angle γ is favorably not less than one degree and less than 180 degrees and more favorably 120 to 140 degrees. By setting the angles β and γ to the above-described angles, it is possible to restrain light from reversely traveling toward the aperture portion 2a.

Thereby as shown in FIG. 10(*c*) the light emitted from the LED light source 4 having a high directivity is diffused in four directions. As the configuration of the main reflector 2, the main reflector 2 is so shaped that the light travels to the light emission surface. Thereby it is possible to increase the utilization efficiency of the light and obtain surface emission for which a decreased number of the LEDs is used.

The action and effect of the construction of the reflection surface of the subsidiary reflector 3 shown in FIGS. 7 and 9 are described below.

In the subsidiary reflector 3 shown in FIG. 7, as apparent from the light beam view (FIG. 8(*b*)), the quadrangular pyramidal configuration prevents the light from traveling toward the aperture portion 2a, but diffuses the light in four directions and orients the light toward the main reflector 2. Therefore the subsidiary reflector 3 shown in FIG. 7 is effective for obtaining surface emission of 1/1 in the ratio between the length of the long side and that of the short side.

Regarding the configuration of the subsidiary reflector 3 shown in FIG. 9, in the case of the rectangular surface light source, a long-side side surface 3f seen in the direction in which the LED light source 4 is arranged is V-shaped. Thus the configuration of the subsidiary reflector 3 shown in FIG. 9 is similar to that of the subsidiary reflector shown in FIG. 7. But the subsidiary reflector 3 has an inclination 3g which gradually departs from the LED light source 4, as the inclination 3g approaches the apex B. The inclination 3g shown in FIG. 9 inclines oppositely to the inclination 3g of the subsidiary reflector 3 shown in FIG. 7.

A short-side side surface 3f, shown in FIG. 9, which is seen in the direction in which the LED light source 4 is arranged has the inverted V-shaped configuration which is inverse to the side surface 3f of the subsidiary reflector 3 shown in FIG. 7.

As indicated in the light beam view (FIG. 10(*c*)), the subsidiary reflector 3 shown in FIG. 9 is similar to the subsidiary reflector 3 shown in FIG. 7 in that both subsidiary reflectors 3 have the operation of preventing light from traveling toward the aperture portion 2a. But a significant characteristic of the subsidiary reflector 3 shown in FIG. 9 is that it has the operation of increasing the reflection amount of light which travels in the direction (longitudinal direction) in which the LED light source 4 is arranged. Thereby the subsidiary reflector 3 shown in FIG. 9 is effective in the case where the light reflected in the direction (longitudinal direction) in which the LED light source 4 is arranged is required to obtain a long surface emission by optimally setting the configuration of the main reflector 2.

In the subsidiary reflector 3 shown in FIG. 7 or 9, ridge lines and apexes of a tetrahedron may be rounded. By rounding the ridge lines and apexes, a die can be produced easily, and a resin-molded article is easily releasable.

The reflection surfaces of the tetrahedron of the subsidiary reflector 3 may have a predetermined, curvature instead of a flat surface. By allowing the reflection surfaces to have the predetermined curvature, it is possible to make a fine adjustment, i.e., it is possible to slightly widen or narrow the range of light which travels to the main reflector 2 and thus improve the uniformity in the surface emission.

In the subsidiary reflector 3, the side surface 3f' of each reflection surface 3f and the rear surface 3h thereof may have a predetermined curvature. Particularly it is possible to provide the rear surface 3h of the reflection surface 3f with the predetermined curvature.

Figure 11:
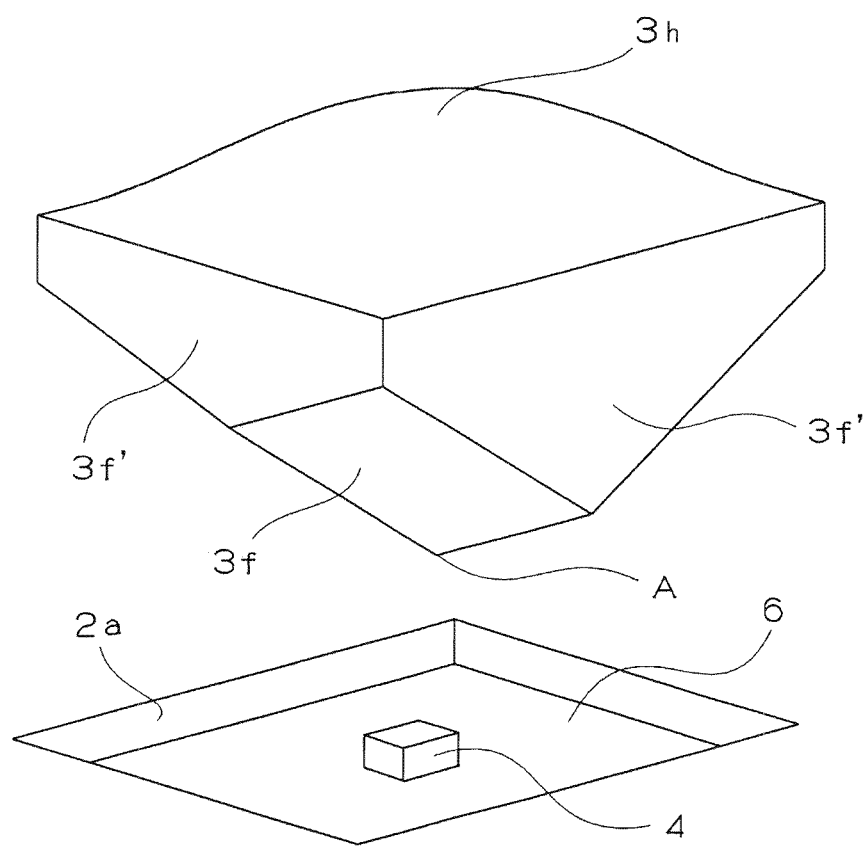
FIG. 11 is a construction view of the subsidiary reflector in which a rear surface of a quadrangular pyramidal reflection surface has a predetermined curvature.

FIG. 11 shows an example in which the rear surface 3h of the reflection surface 3f has the predetermined curvature.

As a result of the reflection of light on the main reflector 2 and the subsidiary reflector 3, scattered light is generated on the reflection surface of each of the main reflector 2 and the subsidiary reflector 3. Light parallel with the rear surface 3h of the reflection surface 3f is present in the scattered light. By imparting the curvature to the rear surface 3h of the reflection surface 3f, the above-described light can be reflected toward the emission surface. Thereby the utilization efficiency of the light can be improved.

Treatment such as reflection coating consisting of a metal film, plating, painting for improving the reflectivity can be performed on the reflection surface 3f of the subsidiary reflector 3.

By performing the treatment for improving the reflectivity of the subsidiary reflector 3, the regular reflectiveness of light to be reflected from the subsidiary reflector 3 is improved. By improving the regular reflectiveness, the reflected component of the scattered light on the subsidiary reflector 3 decreases. When the scattered light is reflected from the subsidiary reflector 3, light which travels to the substrate 6 is generated to some extent. Thus by decreasing the reflected component of the scattered light, the loss of light can be prevented and in addition the control of light can be easily made, which provides the effect of improving the uniformity of the surface emission.

It is necessary that the reflection surface of the main reflector 2 has a configuration which allows light reflected from the subsidiary reflector 3 to travel forward from the surface light source. It is preferable that the inclination of the reflection surface of the main reflector 2 becomes steeper, as the reflection surface of the main reflector 2 becomes distant from the subsidiary reflector 3. When the surface light source is rectangular, it is preferable that the reflection surface of the main reflector 2 is concave when the reflection surface is seen in the short-side direction.

The construction of the reflection surface of the main reflector can be formed by using an expansion polynomial surface (free-form surface) constructed by the following equation.

$$z = \frac{cr^2}{1 + \sqrt{1-(1+k)c^2r^2}} + \sum_{i=1}^{N} A_i E_i(x, y) \quad \text{[Mathematical Expression 1]}$$

The above equation expresses a height Z of a coordinate axis specified by an x-axis (short-side direction of emission surface) and y-axis (long-side direction of emission surface). In the above equation, c, r, and k indicate constants; and A, E, and N indicate the number of multinomial coefficients and coefficients. The short-side direction (X-direction) is a multinomial surface using a value of $(X^2 \times Y^0$ through $X^4 \times Y^0)$. The long-side direction (Z-direction) is a multinomial surface using a value of $(X^0 \times Y^2$ through $X^0 \times Y^6)$.

The lighting system of the present invention is obtained by merely placing the LED surface cover on the LED light source such that the LED light source is positioned at the aperture portion.

It is possible to provide the lighting system with a housing accommodating the lighting system. When the lighting system is provided with the housing, as shown in FIG. 2, it is possible to dispose the functional film 8 light-transmissive or light-semi-transmissive on the front surface of the housing 5. The functional film 8 improves the optical properties of decorative surface forming the front surface of the lighting system using the LED surface cover of the present invention.

As examples of the functional film 8 which improves the optical properties, a light diffusion film, a brightness enhancement film, and a light reflection decrease film are listed.

The light diffusion film improves the uniformity of the surface emission of the lighting system using the LED surface cover of the present invention to a higher extent.

As examples of the light diffusion film, LIGHT-UP (commercial name) produced by KIMOTO Co., Ltd., a diffusion film produced by Nisshinbo Holdings Inc., OPALUS (commercial name) produced by Keiwa Inc., and a diffusion film produced by Tsujiden Co., Ltd. are listed.

Figure 15:
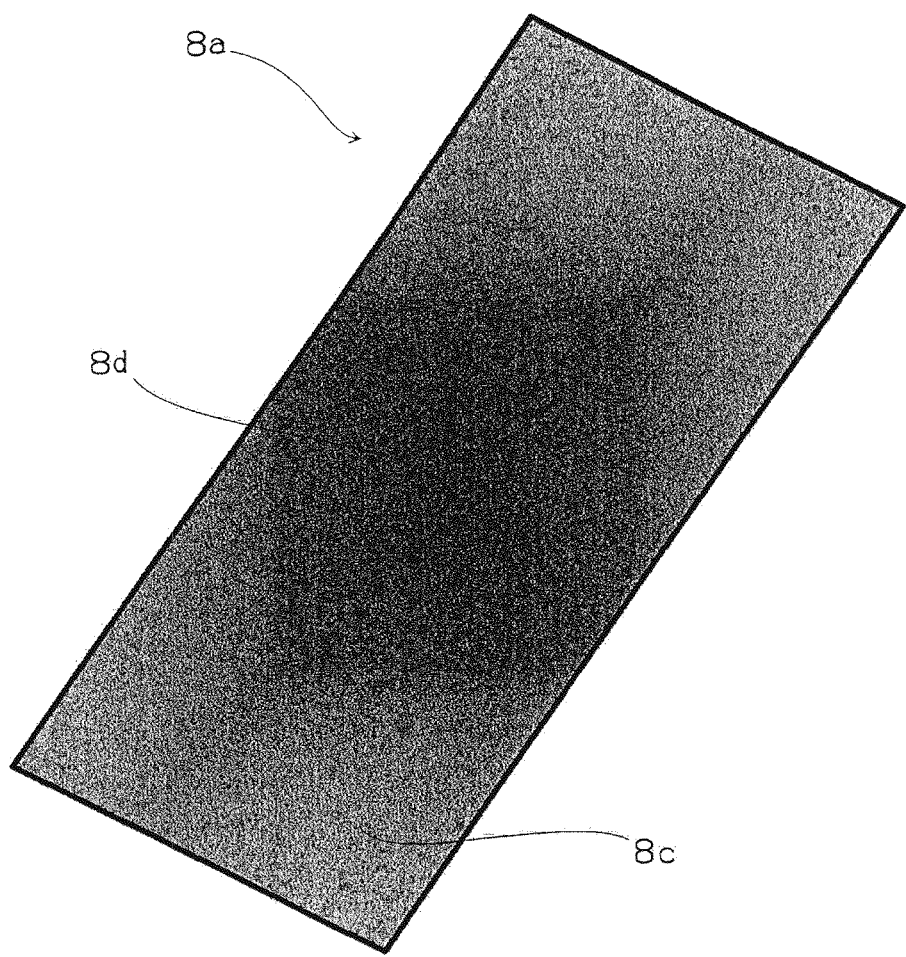
FIG. 15 is a perspective view of a light diffusion film on which gradation printing has been performed.

In the light diffusion film, resin coating or printing which diffuse light can be used to perform gradation printing on a film which is a base material. By controlling the transmittance of the film, unevenness of luminance can be improved to a higher extent. FIG. 15 shows an example of the light diffusion film on which the gradation printing has been performed. FIG. 15 is a perspective view of a light diffusion film 8a on which the gradation printing has been performed.

The gradation printing is performed on the light diffusion film 8a with ink having a color similar to that of the diffusion film in such a way that the luminance is gradually adjusted from a portion 8c where the luminance on the decorative surface of the lighting system is high to a portion 3d where the luminance on the decorative surface thereof is low in the case where the light diffusion film is not used. The portion 8d where the luminance on the decorative surface of the lighting system is low is positioned above the subsidiary reflector 3. The gradation printing is so performed as to improve the transmittance at the portion 8d. The use of this light diffusion film allows the luminance distribution on the decorative surface of the lighting system to be more uniform. The color of ink to be used for the gradation printing may be constructed of ink of a transmission type and a non-transmission type having a color similar to that of the diffusion film.

The use of the light diffusion film 8a makes the luminance distribution uniform, but may lower the luminance of the entire decorative surface of the lighting system.

By layering the brightness enhancement film on the light diffusion film 8a, it is possible to improve the luminance lowered by the use of the light diffusion film 8a.

The brightness enhancement film is composed of a film, excellent in its optical transparency, on which a precise prism pattern is formed and is capable of improving the luminance of the decorative surface.

As examples of the brightness enhancement film, BEF series, BEFRP series, and DBEF series (commercial name) produced by 3M Corporation are listed.

It is also possible to improve the luminance of the decorative surface by layering the light reflection decrease film on the light diffusion film 8a. The light reflection decrease film is excellent in its optical transparency and flexibility. By decreasing the reflection of light, it is possible to improve the luminance of the decorative surface.

As an example of the light reflection decrease film, VISELA (commercial name) produced by INOAC CORPORATION is shown.

In the present invention, as films which can be layered on the light diffusion film 8a, it is possible to use the brightness enhancement film, the light reflection decrease film or a film consisting of the brightness enhancement film and the light reflection decrease film layered thereon.

Figure 16:
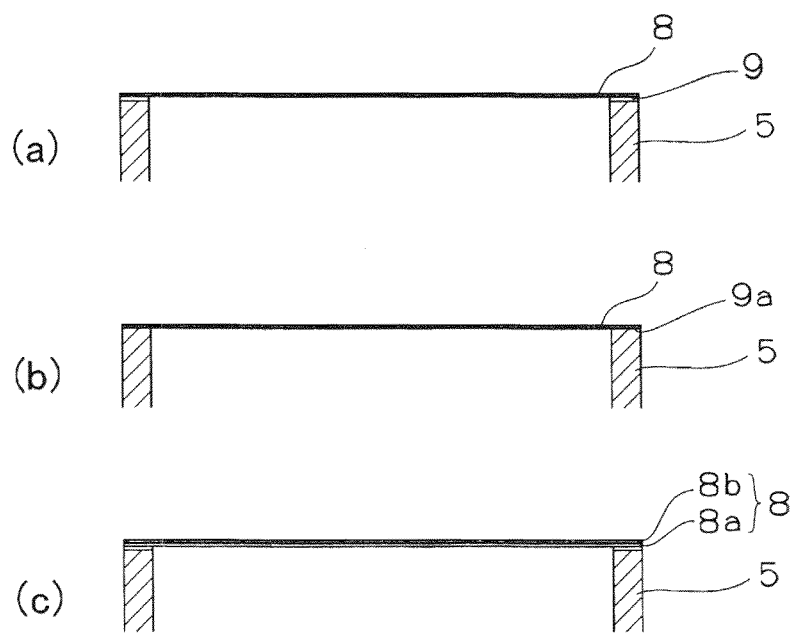
FIG. 16 is a sectional view obtained by enlarging a decorative surface of a lighting system.

FIG. 16 shows a state in which the functional film 8 has been mounted on the lighting system of the present invention. FIG. 16 is a sectional view obtained by enlarging the decorative surface of the lighting system.

The functional film 8 is fixed to the front surface of the housing 5 via an adhesive layer 9 (FIG. 16(*a*)). As the adhesive layer 9, a double-stick tape and an adhesive agent are listed.

In fixing the functional film 8 to the front surface of the housing 5, the functional film 8 can be fixed thereto joy using ultrasonic wave welding or the like without interposing the adhesive layer (FIG. 16(*b*)) therebetween.

The functional film 8 can be composed of the light diffusion film 8a and a brightness enhancement film 8b layered on the surface thereof (FIG. 16(*c*)). The light reflection decrease film can be layered on the surface of the film composed of the light diffusion film 8a and the brightness enhancement film 8b layered on the surface thereof.

Figure 17:
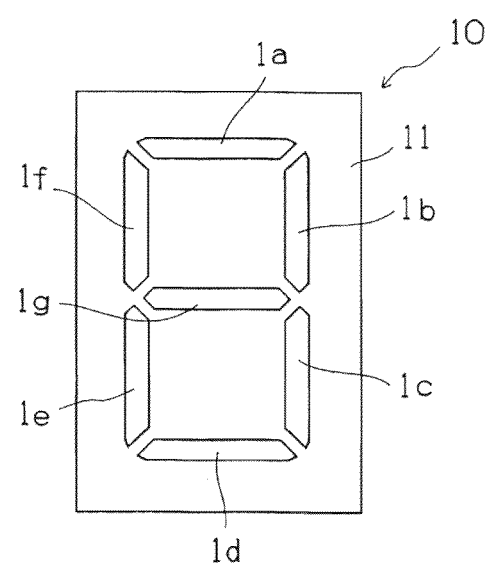
FIG. 17 is a plan view of a display device composed of seven display segments.

The LED lighting system of the present invention provides surface light source illumination having a uniform, luminance by using a small number of the LED light sources. A display device can be constructed by using the LED lighting system as one display segment thereof. FIG. 17 shows an example the display device. FIG. 17 is a plan view of the display device composed of seven display segments.

in a display device 10, seven display segments 1a through 1g are disposed, on a display surface 11 in the figure of eight. By lighting the display segments, figures and the like can be displayed. For example, by lighting the display segments 1a, 1b, 1c, 1d, 1e, and 1f, the figure of zero can be displayed. By composing the LED lighting system of one of the display segments, it is possible to obtain the display device which secures luminance and lights uniformly.

The display device of the present invention can be utilized as the display device which secures luminance and lights uniformly in a product such as an indicator of an elevator having a display plate disposed above an emission portion to secure decorativeness and strength.

EXAMPLES

Example 1

An LED surface cover having an aperture portion, having a size of 4×26 mm, which surface-emits light and a housing, having a height of 7 mm, in which a main reflector and a subsidiary reflector were disposed was formed by integrally molding a highly reflective resin material.

As an LED light source, two LED light sources of a surface-mount type having a directivity of 160 degrees was used by spacing them at an interval of 9 mm. A subsidiary reflector having a reflection configuration shown in FIG. 9 was used.

The distance from a reflection surface of the subsidiary reflector to the LED light source was set to 0.2 to 0.7 mm. An inclination angle $\beta$ of the subsidiary reflector in the sectional surface in the Y-direction (longitudinal direction of aperture portion) in which the LED light sources were disposed at an approximately equal interval was set a 120 to 140 degree. An angle $\gamma$ of the subsidiary reflector in the X-direction sectional surface orthogonal to the Y-direction was set to 200 to 240 degrees.

Figure 12:
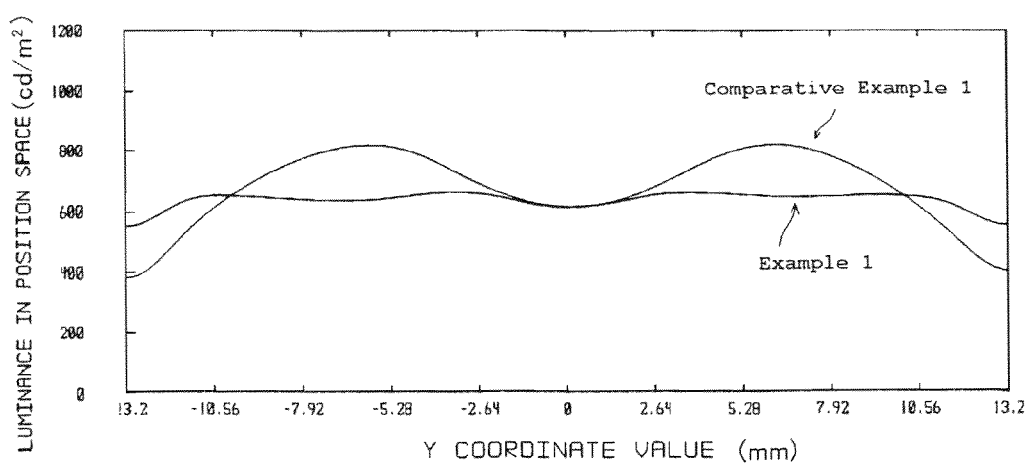
FIG. 12 shows results obtained by measuring a luminance distribution of an emission surface of an LED lighting system.
Figure 13:
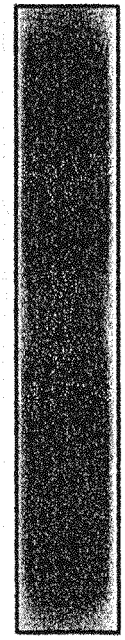
FIG. 13 shows a luminance distribution of an emission surface of an example 1.

The reflection surface of the main reflector was formed of a free-form surface having a curvature which makes the reflection surface thereof steeper toward an end in the X-direction and Y-direction. The dimension of the aperture portion 2a at the bottom of the LED surface cover was set larger than the dimension of the long and short sides of the LED light source by 0.1 to 0.4 mm The LED surface cover was placed on the surface-mount type LED light source to obtain an LED lighting system. FIGS. 12 and 13 show results obtained by measuring the luminance distribution of the emission surface of the obtained LED lighting system. The data shown in FIG. 12 was obtained when the distance from the reflection surface of the subsidiary reflector to the LED light source, the inclination $\beta$ of the subsidiary reflector, and the inclination $\gamma$ of the subsidiary reflector were set to 0.5 mm, 130 degrees, and 220 degrees respectively.

As shown in FIGS. 12 and 13, the obtained lighting system showing surface emission which provided a uniform luminance on the entire emission surface was obtained.

Comparative Example 1

Figure 14:
FIG. 14 shows a luminance distribution of an emission surface of a comparative example 1.

Except that an LED surface cover having an aperture portion, having a size of 4×26 mm, which surface-emits light and a housing, having a height of 7 mm, in which a main reflector and a subsidiary reflector were not disposed was placed on the LED light sources used in the example 1, a lighting system was obtained in a manner similar to that of the example 1. FIGS. 12 and 14 show results obtained by measuring the luminance distribution of the emission surface of the obtained LED lighting system.

As shown in FIGS. 12 and 14, a uniform luminance was not obtained on the entire emission surface.

Example 2

A diffusion film (produced by KIMOTO Co, Ltd., model number: 207, optical transmittance: 59%) was bonded to the front surface of the housing of the LED lighting system obtained in the example 1 with a double-stick tape.

The obtained lighting system showed surface emission which provided a uniform luminance on the entire emission surface.

Example 3

Semi-light-transmissive ink for decreasing the transmittance was gradationally printed on the diffusion film used in the example 2 so that a portion of the diffusion film which had a high luminance when the light diffusion film was not used matched the transmittance of a portion thereof which had a low luminance. The diffusion film on which the gradation printing was carried out was bonded to the front surface of the housing of the LED lighting system obtained in the example 1 by an ultrasonic wave welding method.

The obtained lighting system showed surface emission which provided a uniform luminance on the entire emission surface.

To decrease the transmittance so that the portion of the diffusion film which had a high luminance when the light diffusion film was not used matched the transmittance of a portion thereof which had a low luminance, light-untransmissive ink was printed on the diffusion film gradationally without dots in such a manner that no unevenness was generated when the lighting system lighted up. The obtained lighting system using this diffusion film showed surface emission which provided a uniform luminance on the entire emission surface.

Example 4

A brightness enhancement film (produced by 3M Corporation, BEF1190/24) was layered on the diffusion film used in the example 2. A lighting system similar to that of the example 2 was obtained by using the laminate film. The obtained lighting system showed surface emission which provided a uniform luminance on the entire emission surface.

INDUSTRIAL APPLICABILITY

In the LED surface cover of the present invention, because it is possible to convert the LED light source which is a point light source into the surface light source by a simple method, it is possible to utilize the LED surface cover for the LED lighting system.

EXPLANATION OF REFERENCE SYMBOLS AND NUMERALS

1: surface light emission cover
2: main reflector
3: subsidiary reflector
4: LED light source
5: housing
6: substrate
7: die
8: functional film
9: adhesive layer
10: display device
11: display surface

The invention claimed is:
1. An LED surface cover for converting an LED light source into a surface light source by covering said LED light source therewith, comprising a main reflector which reflects light forward from said surface light source and a subsidiary reflector having a reflection surface which reflects light emitted from said LED light source to said main reflector; wherein said main reflector has an aperture portion where said LED light source can be disposed and has a curved surface for traveling light reflected from said subsidiary reflector to a region forward from said surface fight source; and said subsidiary reflector is disposed above said aperture portion, and said reflection surface has an inclination with respect to a surface of said aperture portion,
wherein said subsidiary reflector has a supporting pillar for coupling said subsidiary reflector and said main reflector to each other; said supporting pillar being a polygon whose cross-section has at least one pair of parallel lines; a median line of said parallel lines being disposed along an optical axis of said light emitted from said LED light source.
2. The LED surface cover according to claim 1, wherein said LED surface cover is made of a resin molding, said resin molding being an integrally molded article formed by using a die.
3. The LED surface cover according to claim 2, wherein a projected area of said subsidiary reflector on a surface of said surface light source is set to not more than an area of said aperture portion.
4. The LED surface cover according to claims 1, 2 or 3, wherein a cross-section of a base portion of said supporting pillar at a main reflector-side is set larger than a cross-section of a portion of said supporting pillar at a subsidiary reflector-side.
5. The LED surface cover according to claim 4, wherein said cross-section of said base portion of said supporting pillar at said main reflector-side is a quadrangle; and a length of any of sides of said quadrangle other than a pair of parallel lines constructing said quadrangle is less than ⅔ of a maximum length of said parallel lines.
6. The LED surface cover according to claim 1, wherein said subsidiary reflector has a reflection surface consisting of a polyhedron or an inverted conic surface having an apex at a light-source side of an optical axis of light emitted upward from said LED light source.
7. The LED surface cover according to claim 6, wherein said polyhedron is a tetrahedron; and a sectional surface thereof in said optical axis direction is V-shaped at said apex.
8. The LED surface cover according to claim 6, wherein said polyhedron is a tetrahedron; a sectional surface thereof in said optical axis direction is V-shaped at said apex; and a sectional surface thereof in a direction intersecting with said V-shaped sectional surface is inverted V-shaped.
9. The LED surface cover according to claim 6, wherein said reflection surface of said subsidiary reflector is subjected to treatment for improving an optical reflectivity.
10. The LED surface cover according to claim 1, wherein in said subsidiary reflector, at least one of a side surface of said reflection surface and a rear surface thereof has a predetermined curvature.
11. The LED surface cover according to claim 10, wherein said rear surface has a predetermined curvature.
12. An LED lighting system comprising an LED light source and an LED surface cover so disposed that said LED light source is positioned at an aperture portion of said LED surface cover, wherein said LED surface cover is as defined in claim 1.
13. The LED lighting system comprising an LED light source and an LED surface cover disposed inside a housing in such a way that said LED light source is positioned at an aperture portion of said LED surface cover; and a functional film is mounted on a front surface of said LED surface cover, wherein said LED surface cover is as defined in claim 1.
14. The LED lighting system according to claim 13, wherein said functional film is a light diffusion film.
15. The LED lighting system according to claim 14, wherein said light diffusion film has a film surface capable of controlling an optical transmittance.
16. The LED lighting system according to claim 13, wherein said functional film is a laminate film composed of a light diffusion film and at least one film, selected from among a brightness enhancement film and a light reflection decrease film, which is layered on said light diffusion film.
17. A display device comprising an LED lighting system as one display segment thereof, wherein said display segment is an LED lighting system according to claim 12 or 13.
18. An LED surface cover for converting an LED light source into a surface light source by covering said LED light source therewith,
said LED surface cover comprising a main reflector which reflects light forward from said surface light source and a subsidiary reflector having a reflection surface which reflects light emitted from said LED light source to said main reflector;

wherein said main reflector has an aperture portion where said LED light source can be disposed and has a curved surface for traveling light reflected from said subsidiary reflector to a region forward from said surface light source, and said subsidiary reflector is disposed above said aperture portion, and said reflection surface has an inclination with respect to a surface of said aperture portion, wherein said subsidiary reflector has a reflection surface consisting of a tetrahedron having an apex at a light-source side of an optical axis of light emitted upward from said LED light source, wherein a sectional surface thereof in said optical axis direction is V-shaped at said apex; and a sectional surface thereof in a direction intersecting with said V-shaped sectional surface has an inverted V-shape.

19. The LED surface cover according to claim 18, wherein in said subsidiary reflector, at least one of a side surface of said reflection surface and a rear surface thereof has a predetermined curvature.

20. The LED surface cover according to claim 19, wherein said rear surface has a predetermined curvature.

21. The LED surface cover according to claim 18, wherein said reflection surface of said subsidiary reflector is subjected to treatment for improving an optical reflectivity.

22. An LED lighting system comprising an LED light source and an LED surface cover so disposed that said LED light source is positioned at an aperture portion of said LED surface cover, wherein said LED surface cover is as defined in claim 18.

23. The LED lighting system comprising an LED light source and an LED surface cover disposed inside a housing in such a way that said LED light source is positioned at an aperture portion of said LED surface cover; and a functional film is mounted on a front surface of said LED surface cover, wherein said LED surface cover is as defined in claim 18.

24. A display device comprising an LED lighting system as one display segment thereof, wherein said display segment is an LED lighting system according to claim 22 or 23.

* * * * *